US011476839B2

(12) United States Patent
Watabe

(10) Patent No.: US 11,476,839 B2
(45) Date of Patent: Oct. 18, 2022

(54) LVDS DRIVER

(71) Applicant: Ricoh Company, Ltd., Tokyo (JP)

(72) Inventor: Yuji Watabe, Osaka (JP)

(73) Assignee: RICOH COMPANY, LTD., Tokyo (JP)

(*) Notice: Subject to any disclaimer, the term of this patent is extended or adjusted under 35 U.S.C. 154(b) by 0 days.

(21) Appl. No.: 17/201,326

(22) Filed: Mar. 15, 2021

(65) Prior Publication Data

US 2021/0297065 A1    Sep. 23, 2021

(30) Foreign Application Priority Data

Mar. 19, 2020  (JP) .............................. JP2020-050210

(51) Int. Cl.
*H03K 17/687* (2006.01)
*H03K 3/012* (2006.01)

(52) U.S. Cl.
CPC ......... *H03K 3/012* (2013.01); *H03K 17/6872* (2013.01)

(58) Field of Classification Search
CPC .............................. H03K 3/012; H03K 17/682
See application file for complete search history.

(56) References Cited

U.S. PATENT DOCUMENTS

| | | | |
|---|---|---|---|
| 6,992,508 B2 * | 1/2006 | Chow | H03K 19/018585 326/82 |
| 10,447,246 B1 * | 10/2019 | Tripathi | H03K 3/356034 |
| 2013/0076404 A1 * | 3/2013 | Lee | H03K 17/002 327/108 |
| 2014/0002151 A1 | 1/2014 | Watabe et al. | |
| 2015/0155875 A1 * | 6/2015 | Wada | H03K 19/018514 327/108 |
| 2018/0139076 A1 * | 5/2018 | Watabe | H04L 25/0272 |

FOREIGN PATENT DOCUMENTS

| JP | 2004-289354 | 10/2004 |
|---|---|---|
| JP | 2004-336236 | 11/2004 |
| JP | 2007-208705 | 8/2007 |
| JP | 2008-236064 | 10/2008 |
| JP | 2011-188323 | 9/2011 |
| JP | 2015-122644 | 7/2015 |
| JP | 2017-112458 | 6/2017 |
| JP | 2017-199999 | 11/2017 |
| JP | 2018-085713 | 5/2018 |

* cited by examiner

*Primary Examiner* — Sibin Chen
(74) *Attorney, Agent, or Firm* — Xsensus LLP

(57) ABSTRACT

A low voltage differential signal driver includes an output driver including an N-channel source follower, a P-channel source follower, and a plurality of differential switching circuits, a plurality of high-potential output control circuits to control a terminal of the N-channel source follower of the output driver to make a high-potential output of the differential output from the output driver have a prescribed value, a plurality of low-potential output control circuits to control a terminal of the P-channel source follower of the output driver to make a low-potential output of the differential output from the output driver have a prescribed value, a high-potential generation circuit used in common for the plurality of high-potential output control circuits, and a low-potential generation circuit used in common for the plurality of low-potential output control circuits. The output driver outputs a differential output, and one of the plurality of high-potential output control circuits.

5 Claims, 10 Drawing Sheets

US 11,476,839 B2

LVDS DRIVER

CROSS-REFERENCE TO RELATED APPLICATION

This patent application is based on and claims priority pursuant to 35 U.S.C. § 119(a) to Japanese Patent Application No. 2020-050210, filed on Mar. 19, 2020, in the Japan Patent Office, the entire disclosure of which is hereby incorporated by reference herein.

BACKGROUND

Technical Field

Embodiments of the present disclosure relate to a low voltage differential signal (LVDS) driver.

Background Art

Currently, a method or technique using the low voltage differential signaling (LVDS) is adopted in order to satisfy the demands for high-speed data transmission. As known in the art, when such a method or technique is adopted, the electro magnetic interference (EMI) can efficiently be controlled compared with the full-swing transmission of digital signal.

In particular, technologies are known in the art in which a low voltage differential signal (LVDS) driver is used for an output circuit for a line sensor and a plurality of output drivers are controlled by one pair of a high-potential output control circuit and a low-potential output control circuit that reduce variations in output power.

SUMMARY

Embodiments of the present disclosure described herein provide a low voltage differential signal driver including an output driver including an N-channel source follower, a P-channel source follower, and a plurality of differential switching circuits, a plurality of high-potential output control circuits to control a terminal of the N-channel source follower of the output driver to make a high-potential output of the differential output from the output driver have a prescribed value, a plurality of low-potential output control circuits to control a terminal of the P-channel source follower of the output driver to make a low-potential output of the differential output from the output driver have a prescribed value, a high-potential generation circuit used in common for the plurality of high-potential output control circuits, and a low-potential generation circuit used in common for the plurality of low-potential output control circuits. The output driver outputs a differential output, and one of the plurality of high-potential output control circuits and one of the plurality of low-potential output control circuits being used in a pair. The high-potential generation circuit supplies the plurality of high-potential output control circuits with a prescribed driving voltage, and the low-potential generation circuit supplies the plurality of low-potential output control circuits with a prescribed driving voltage.

BRIEF DESCRIPTION OF THE DRAWINGS

A more complete appreciation of embodiments and the many attendant advantages thereof will be readily obtained as the same becomes better understood by reference to the following detailed description when considered in connection with the accompanying drawings.

Figure 1:
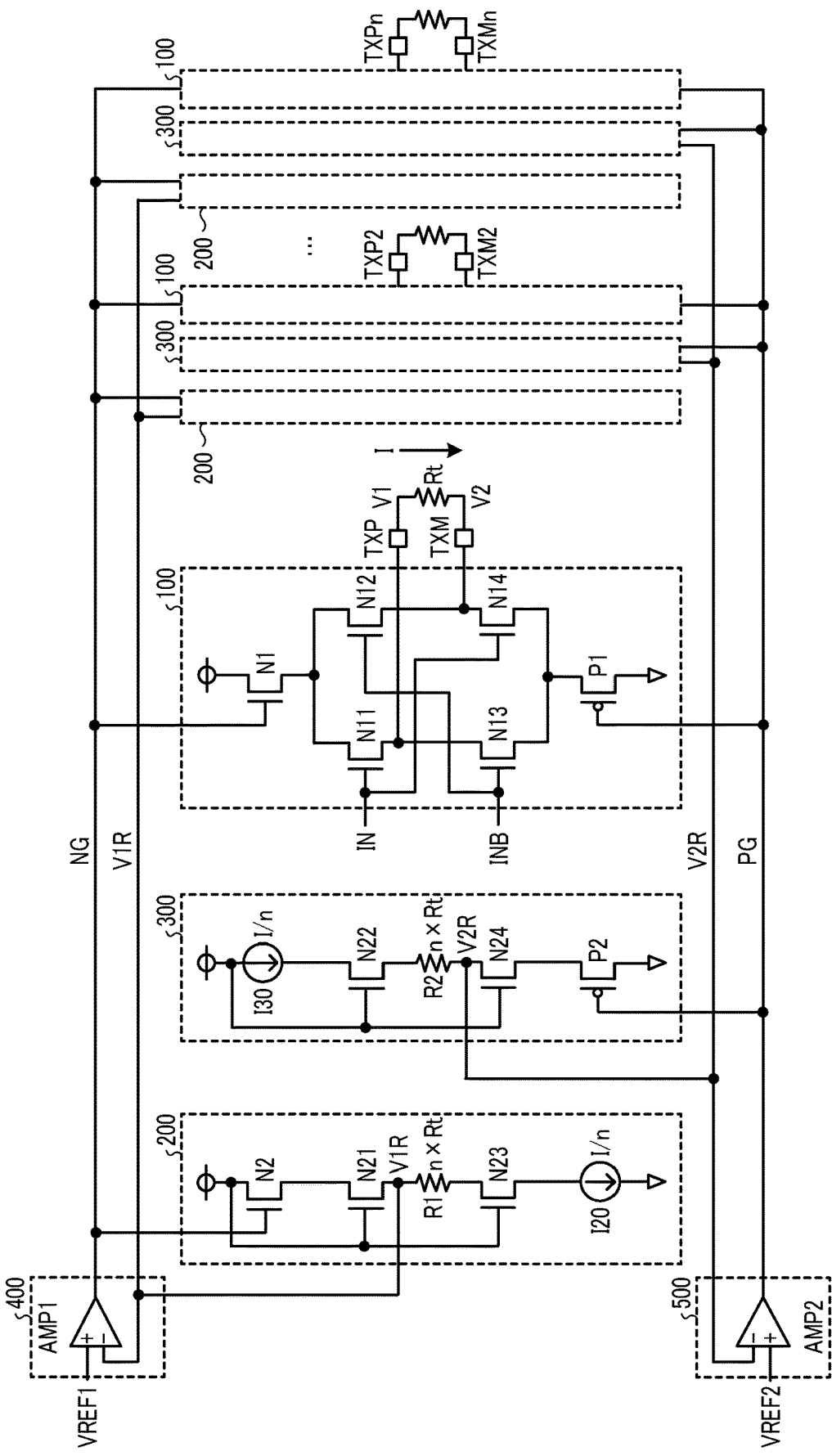
FIG. 1 is a diagram illustrating a configuration or structure of a low voltage differential signal (LVDS) driver according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

A low voltage differential signal (LVDS) driver according to an embodiment of the present disclosure is described below in detail with reference to the accompanying drawings.

First Embodiment

FIG. 1 is a diagram illustrating a configuration or structure of a LVDS driver according to a first embodiment of the present disclosure.

As illustrated in FIG. 1, the LVDS driver includes an output driver 100, a high-potential output control circuit 200, a low-potential output control circuit 300, a high-potential generation circuit 400, and a low-potential generation circuit 500.

As illustrated in FIG. 1, the output driver 100 includes an N-channel metal oxide semiconductor (NMOS) source follower N1 that is an N-type source follower in which the drain is coupled to the power source, a P-channel metal oxide semiconductors (PMOS) source follower P1 that is a P-type source follower in which the drain is coupled to the ground (GND), and a plurality of output switches N11, N12, N13, and N14 each of which is composed of an N-channel metal oxide semiconductor (NMOS). The output switches N11, N12, N13, and N14 configure a plurality of differential switching circuits. In the output driver 100, a data signal IN is input to the gates (terminals) of the output switches N11 and N14, and a data signal INB that is an inverse signal of the data signal IN is input to the gates of the output switches N12 and N13.

An output terminal TXP of the output driver 100 is coupled to the drains of the output switches N11 and N13, and an output terminal TXM of the output driver 100 is coupled to the drains of the output switches N12 and N14. Moreover, a terminator Rt is externally coupled to the output driver 100 at some midpoint between the output terminal TXP and the output terminal TXM.

When the data signal IN is H and the data signal INB is L, the output switches N11 and N14 are turned on, and an electric current I flows through the terminator Rt from the output terminal TXP to the output terminal TXM.

By contrast, when the data signal IN is L and the data signal INB is H, the output switches N12 and N13 are turned on, and the electric current I flows through the terminator Rt from the output terminal TXM to the output terminal TXP.

Assuming that the H voltage and the L voltage of the output terminal TXP are V1 and V2, respectively, in the present embodiment, the following equation is satisfied.

$$V1-V2=I \times Rt$$

The high-potential output control circuit 200 is a replication circuit used to control the electrical potential of V1 to a predetermined electrical potential when the data signal IN is H and the data signal INB is L in the output driver 100.

The high-potential output control circuit 200 includes an NMOS source follower N2 in which the drain is coupled to the power source, an N-channel metal oxide semiconductor (NMOS) switching transistor N21 in which the gate is coupled to the power source and the source is coupled to the source of the NMOS source follower N2, a resistor R1 whose one end is coupled to the drain of the NMOS switching transistor N21, and an NMOS switching transistor N23 in which the source is coupled to a constant-current source 120, the gate is coupled to the power source, and the drain is coupled to the other end of the resistor R1.

The high-potential generation circuit 400 includes a differential amplifier AMP1 in which a first reference voltage VREF1 is input to a non-inverted input terminal, an inverted input terminal is coupled to a connection point between the resistor R1 and the drain of the NMOS switching transistor N21 of the high-potential output control circuit 200, and an output terminal outputs a signal to the gate of the NMOS source follower N2 of the high-potential output control circuit 200 and the gate of the NMOS source follower N1 of the output driver 100.

As illustrated in FIG. 1, the LVDS driver includes a plurality of channels, and the inverted input terminal is also coupled to another connection point between the resistor R1 and the drain of the NMOS switching transistor N21 of the high-potential output control circuit 200. In a similar manner, the output terminal outputs a signal to another gate of the NMOS source follower N2 of the high-potential output control circuit 200 and another gate of the NMOS source follower N1 of the output driver 100.

In the present specific embodiment, it is assumed that the level of resistance of the resistor R1 is n times greater than that of the terminating resistor Rt, the sizes of the NMOS source follower N2, the NMOS switching transistor N21, the NMOS switching transistor N23 are 1/n of the NMOS source follower N1, the output switch N11, and the output switch N14, respectively, and that 1/n electric current of the electric current I that is flown to the terminating resistor Rt is flown from the constant-current source 120 to the resistor R1.

The differential amplifier AMP1 controls the voltage at the node V1R to be equivalent to the reference voltage VREF1. Due to such a configuration, the output driver 100 is replicated, and the H voltage of the output terminal TXP of the output driver 100 is controlled to be equivalent to the reference voltage VREF1.

The low-potential output control circuit 300 is a replication circuit used to control the electrical potential of V2 to a predetermined electrical potential when the data signal IN is H and the data signal INB is L in the output driver 100.

The low-potential output control circuit 300 includes a PMOS source follower P2 in which the drain is coupled to the ground (GND), an NMOS switching transistor N24 in which the source is coupled to the source of the PMOS source follower P2 and the gate is coupled to the power source, a resistor R2 whose one end is coupled to the drain of the NMOS switching transistor N24, and an NMOS switching transistor N22 in which the source is coupled to a constant-current source 130, the gate is coupled to the power source, and the drain is coupled to the other end of the resistor R2.

The low-potential generation circuit 500 includes differential amplifier AMP2 in which a second reference voltage VREF2 is input to a non-inverted input terminal, an inverted input terminal is coupled to a connection point between the resistor R2 and the drain of the NMOS switching transistor N24 of the low-potential output control circuit 300, and an output terminal outputs a signal to the gate of the PMOS source follower P2 of the low-potential output control circuit 300 and the gate of the PMOS source follower P1 of the output driver 100.

As illustrated in FIG. 1, the LVDS driver includes a plurality of channels, and the inverted input terminal is also coupled to another connection point between the resistor R2 and the drain of the NMOS switching transistor N24 of the low-potential output control circuit 300. In a similar manner, the output terminal outputs a signal to another gate of the PMOS source follower P2 of the low-potential output control circuit 300 and another gate of the PMOS source follower P1 of the output driver 100.

In the present specific embodiment, it is assumed that the level of resistance of the resistor R2 is n times greater than that of the terminating resistor Rt, the sizes of the PMOS source follower P2, the NMOS switching transistor N22, the NMOS switching transistor N24 are 1/n of the PMOS source follower P1, the output switch N11, and the output switch N14, respectively, and that 1/n electric current of the electric current I that is flown to the terminating resistor Rt is flown from the constant-current source 130 to the resistor R2.

The differential amplifier AMP2 controls the voltage at the node V2R to be equivalent to the reference voltage VREF2. Due to such a configuration, the output driver 100 is replicated, and the L voltage of the output terminal TXM of the output driver 100 is controlled to be equivalent to the reference voltage VREF2.

Moreover, in the present embodiment, the size of the transistor is equivalent to each other between the output switch N11 and the output switch N12, and the size of the transistor is equivalent to each other between the output switch N13 and the output switch N14. When the data signal IN is L and the data signal INB is H, the H voltage of the output terminal TXM of the output driver 100 is controlled to be equivalent to the reference voltage VREF1, and the L voltage of the output terminal TXP is controlled to be equivalent to the reference voltage VREF2. Due to such a configuration as described above, the H voltage of the output terminals TXP and TXM of the output driver 100 is controlled to be equivalent to the reference voltage VREF1, and the L voltage of the output terminals TXP and TXM of the output driver 100 is controlled to be equivalent to the reference voltage VREF2.

The reference voltage VREF1 and the reference voltage VREF2 are designed such that the common-mode voltage Vcom of the LVDS driver will be (VREF1+VREF2)/2. Due to such a configuration, the common-mode voltage can be stabilized at a desired value.

For example, when the output common-mode voltage of the LVDS driver is 1.25 V and the differential output voltage of the LVDS driver is 0.35 V, the reference voltage VREF1 and the reference voltage VREF2 are designed to be 1.425 volts (V) and 1.075 V, respectively.

The output resistance of the output terminal TXP of the output driver 100 is equivalent to the sum of the ON resistance of the output switch N11 and the output resistance of the output switch N1. The ON resistance of the NMOS switching transistor N21 of the high-potential output control circuit 200 is n times greater than the ON resistance of the output switch N11, and the output resistance of the NMOS source follower N2 is n times greater than the output resistance of the NMOS source follower N1.

In a similar manner to the above, the output resistance of the output terminal TXM of the output driver 100 is equivalent to the sum of the ON resistance of the output switch N14 and the output resistance of the PMOS source follower P1. The ON resistance of the NMOS switching transistor N24 of the low-potential output control circuit 300 is n times greater than the ON resistance of the output switch N14, and the output resistance of the PMOS source follower P2 is n times greater than the output resistance of the PMOS source follower P1.

The layout of the LVDS driver is described below.

Figure 2:
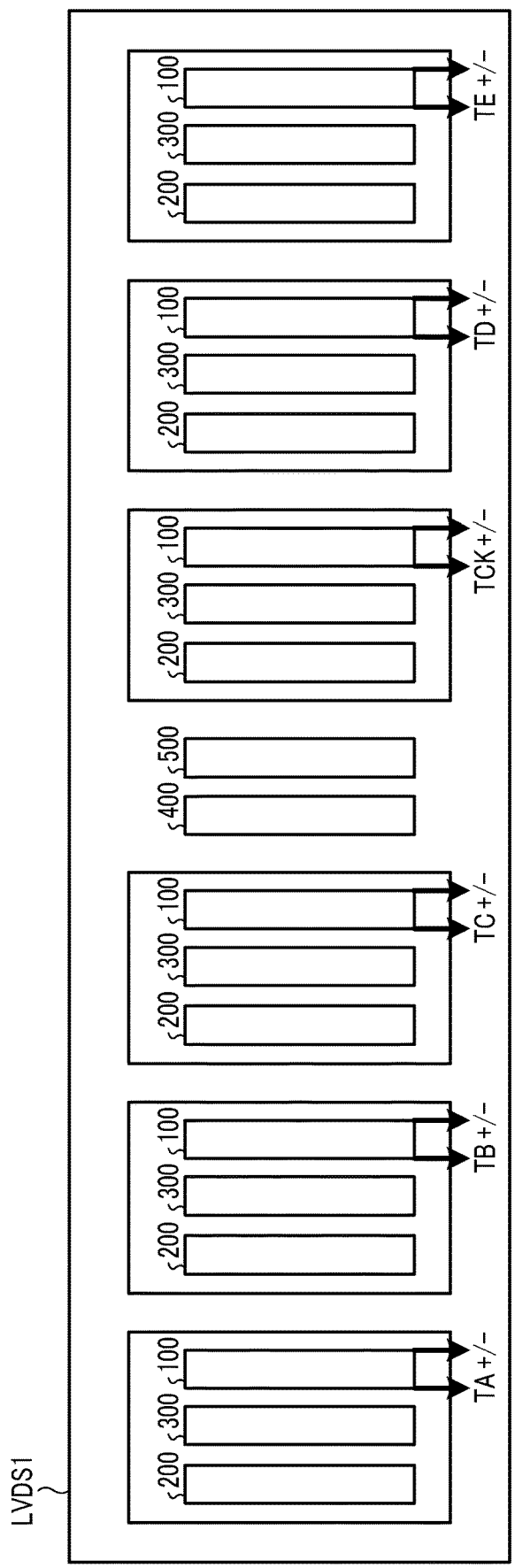
FIG. 2 is a diagram illustrating a layout of the LVDS driver of FIG. 1.

FIG. 2 is a diagram illustrating a layout of the LVDS driver of FIG. 1, according to the present embodiment.

The LVDS driver as illustrated in FIG. 2 is configured by six channels consisting of DATA including five channels, i.e., TA, TB, TC, TD, and TE, and CLK, i.e., TCK.

The high-potential generation circuit 400 and the low-potential generation circuit 500 that supply a control signal to each channel are disposed in the center of the LVDS block. The high-potential output control circuit 200 and the low-potential output control circuit 300, each of which is a replication, are disposed close to the output driver 100 in view of the matching, and such a set of circuits forms one channel. In the present specific embodiment, six sets of channel each of which includes the circuits as described above are arranged.

According to the layout of the LVDS driver as illustrated in FIG. 2, the high-potential generation circuit 400 and the low-potential generation circuit 500 are used in common. As a result, the current consumption can be reduced, and an LVDS driver with a high degree of precision can be implemented.

Figure 3:
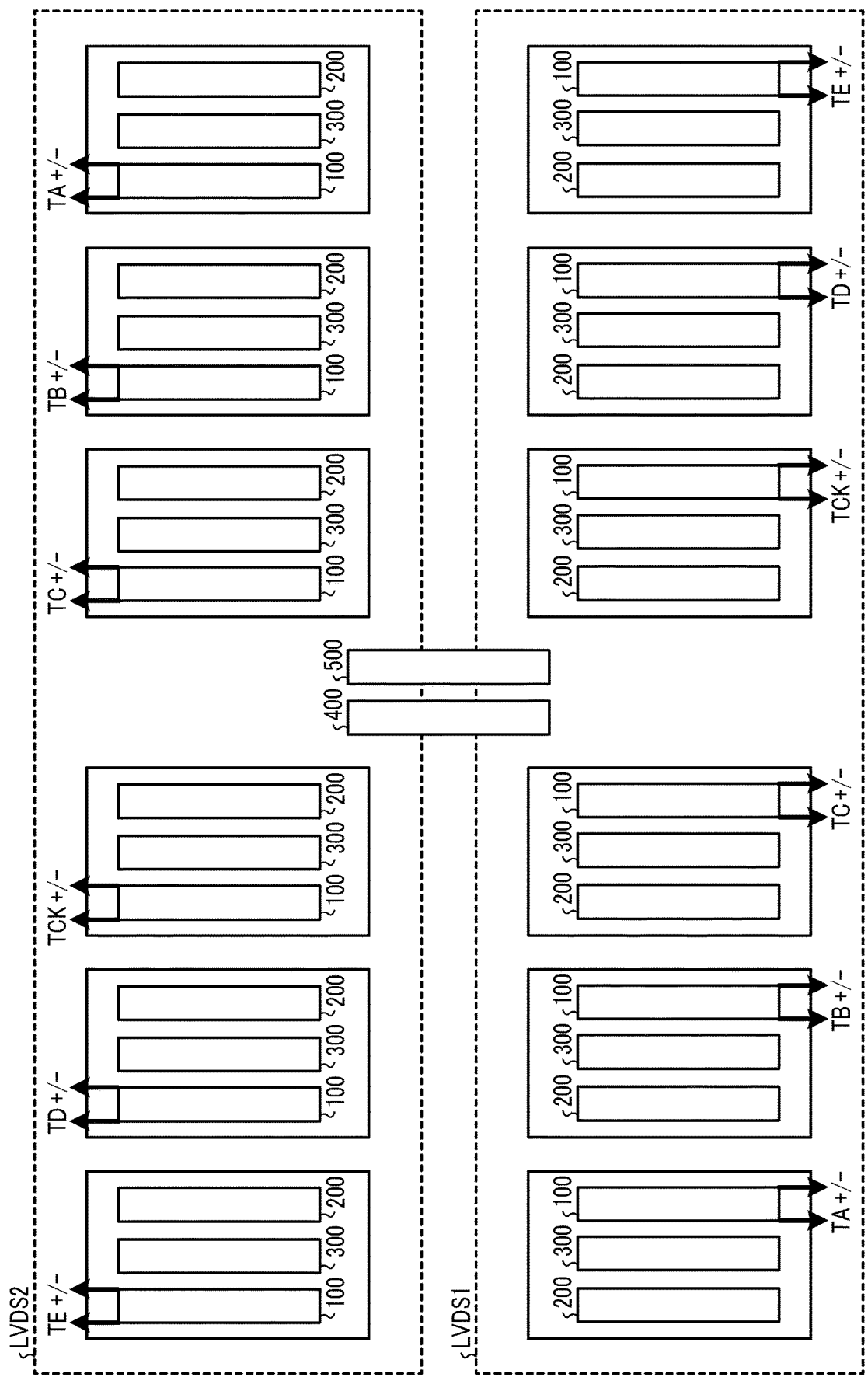
FIG. 3 is a diagram illustrating another layout of the LVDS driver of FIG. 1.

FIG. 3 is a diagram illustrating another layout of the LVDS driver of FIG. 1, according to the present embodiment.

More specifically, FIG. 3 illustrates a layout in which a pair of LVDS drivers each of which consists of six channels (6CH) including CLK, i.e., TCK and DATA including five channels (5CH), i.e., TA, TB, TC, TD, and TE are arranged, according to the present embodiment.

As illustrated in FIG. 3, the high-potential generation circuit 400 and the low-potential generation circuit 500 that are used in common in a single unit of LVDS driver may be used in common between a pair of LVDS drivers.

According to the layout of the LVDS drivers as illustrated in FIG. 3, the current consumption of a pair of the high-potential generation circuit 400 and the low-potential generation circuit 500 can further be reduced.

When even-numbered channels such as six channels (6CH) are adopted, the high-potential generation circuit 400 and the low-potential generation circuit 500 are disposed in the center of the LVDS block. However, when odd-numbered channels such as seven channels (7CH) are adopted, the high-potential generation circuit 400 and the low-potential generation circuit 500 are disposed at a position where the channels are divided into two groups of three channels (3CH) and four channels (4CH).

As described above, according to the present embodiment, one pair of the high-potential generation circuit 400 and the low-potential generation circuit 500 in common supplies a plurality of pairs of the high-potential output control circuit 200 and the low-potential output control circuit 300 with a voltage. Due to such a configuration, the circuit scale and the current consumption can effectively be reduced.

Moreover, in the present embodiment, one of the operational amplifiers of the high-potential generation circuit 400 and the low-potential generation circuit 500 is used to supply a plurality of pairs of the high-potential output control circuit 200 and the low-potential output control circuit 300 with a driving voltage. Due to such a layout in which a plurality of circuits are disposed close to each other, voltage mismatches between a pair of output drivers can be prevented from occurring, and the variations in output voltage and output amplitude between a pair of channels can be reduced.

Further, a replication of the output driver 100 is formed, and the differential amplifier performs feedback control such that the electrical potential between the output switch and the resistance will fall within a prescribed range of voltage. Due to such a configuration, the output voltage of the LVDS driver can accurately be maintained to have a desired value without being influenced by, for example, the variations in the value of integral resistance.

Second Embodiment

A second embodiment of the present disclosure is described below.

Note that the second embodiment of the present disclosure as will be described later is different from the first embodiment as described above in respect that the output resistance of the output driver can be adjusted to have a desired value in view of the impedance of a transmission line at the subsequent stage. Note that like reference signs are given to elements similar to those described in the first embodiment, and their detailed description is omitted in the description of the second embodiment of the present disclosure.

Figure 4:
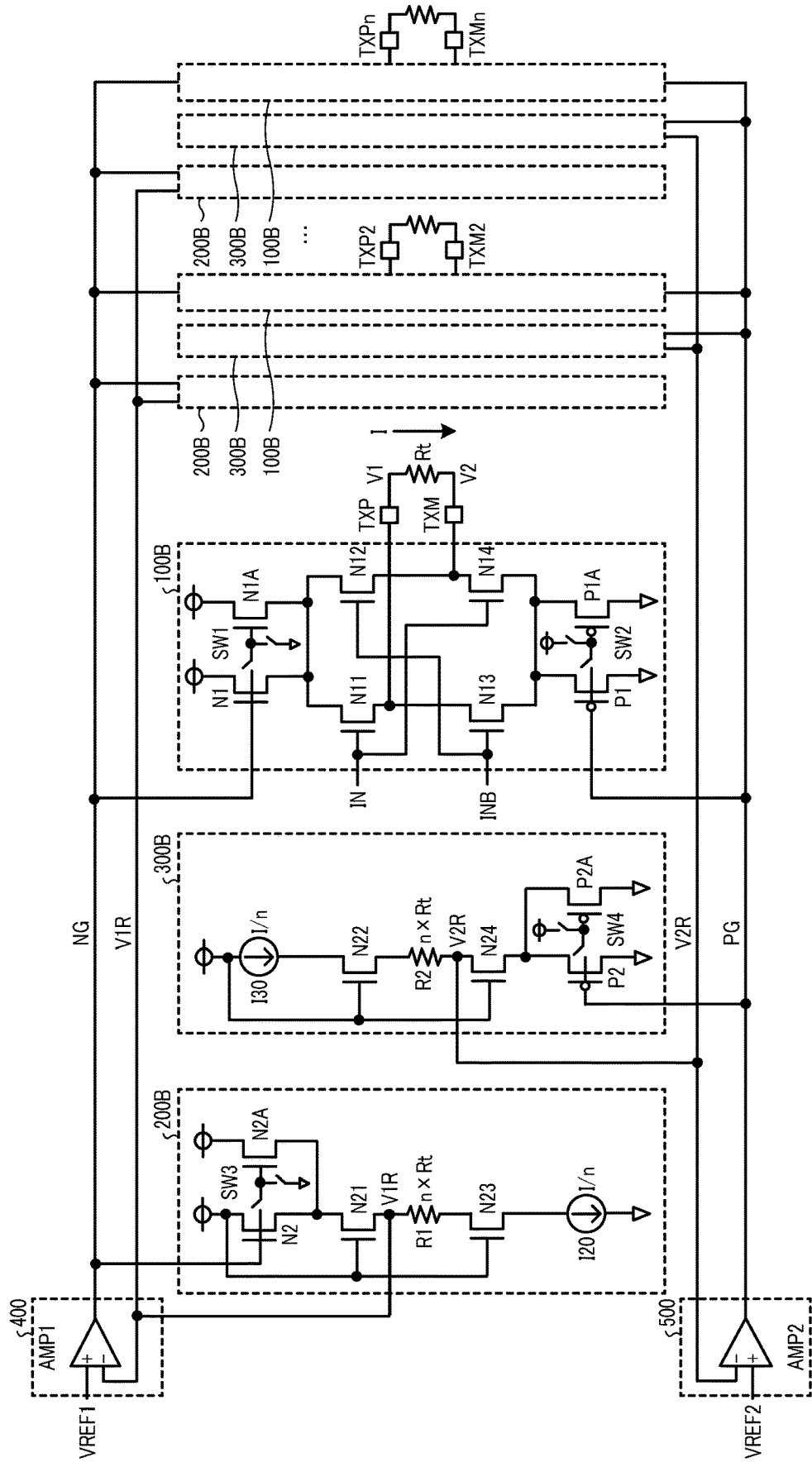
FIG. 4 is a diagram illustrating a configuration or structure of a LVDS driver according to a second embodiment of the present disclosure.

FIG. 4 is a diagram illustrating a configuration or structure of the LVDS driver according to a second embodiment of the present disclosure.

As illustrated in FIG. 4, an output driver 100B of the LVDS driver according to the present embodiment is configured in such a manner that the NMOS source follower N1 and an NMOS source follower N1A are arranged in parallel and the transistor size is switched by a switch SW1. Accordingly, the output resistance can be switched with a simple configuration.

A high-potential output control circuit 200B that is a replication of the output driver 100B is configured in such a manner that the source follower N2 and a source follower N2A are arranged in parallel and the transistor size is switched by a switch SW3. In the present specific embodiment, the transistor size of the NMOS source followers N2 and N2A of the high-potential output control circuit 200B is reduced to as small as 1/n of the NMOS source followers N1 and N1A of the output driver 100B. As a result, the output resistance can be adjusted to have a desired value.

Moreover, the output driver 100B is configured in such a manner that the PMOS source follower P1 and a PMOS source follower P1A are arranged in parallel and the transistor size is switched by a switch SW2. Accordingly, the output resistance can be switched with a simple configuration.

A low-potential output control circuit 300B that is a replication of the output driver 100B is configured in such a manner that the PMOS source follower P2 and a PMOS source follower P2A are arranged in parallel and the transistor size is switched by a switch SW4. In the present specific embodiment, the transistor size of the PMOS source followers P2 and P2A of the low-potential output control circuit 300B is reduced to as small as 1/n of the PMOS source followers P1 and P1A of the output driver 100B. As a result, the output resistance can be adjusted to have a desired value.

As described above, according to the present embodiment, a value of the output resistance of the output driver can be adjusted to have a desired value in view of the impedance of a transmission line at the subsequent stage. Accordingly, the reflection of the driver can be prevented, and the quality of a signal can be maintained in a good condition.

Moreover, in the present embodiment, the high-potential generation circuit 400 and the low-potential generation circuit 500 are configured to be used in common such that the power consumption will be reduced and the output resistance can be switched. Due to such a configuration, the parasitic capacitance that is caused to an output signal NG from the high-potential generation circuit 400 and an output signal PG from the low-potential generation circuit 500 increases. As a result, the electrical potential of the output signals NG and PG are further stabilized, and the output voltage of the LVDS driver can be maintained with a high degree of precision.

Third Embodiment

A third embodiment of the present disclosure is described below.

Note that the third embodiment of the present disclosure as will be described later is different from the first embodiment and the second embodiment of the present disclosure as described above in a respect that, in the third embodiment of the present disclosure, each one of the switches as described above in the first embodiment of the present disclosure is divided into three NMOS switches that are arranged parallel to each other. Note that like reference signs are given to elements similar to those described in the first embodiment and the second embodiment, and their detailed description is omitted in the following description of the third embodiment of the present disclosure.

Figure 5:
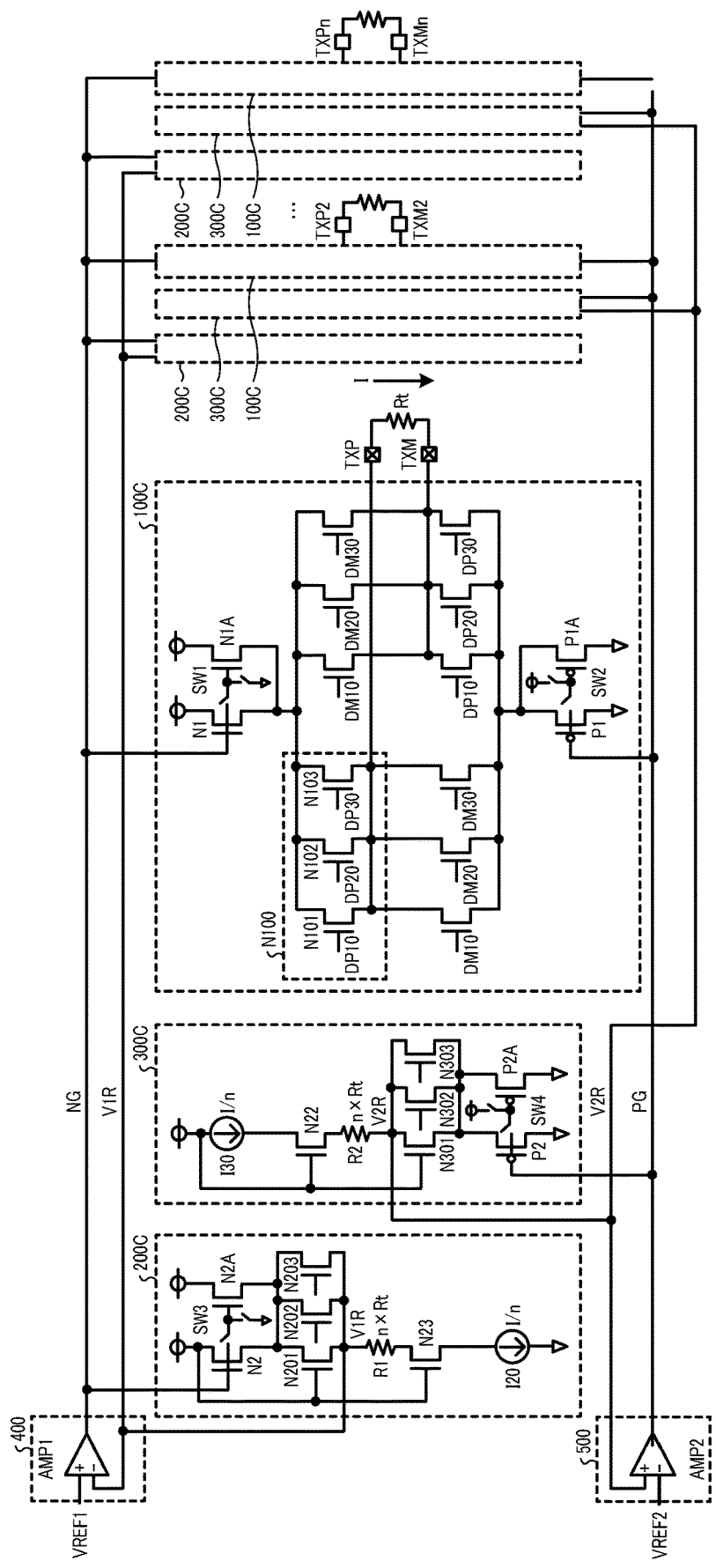
FIG. 5 is a diagram illustrating a configuration or structure of a LVDS driver according to a third embodiment of the present disclosure.

FIG. 5 is a diagram illustrating a configuration or structure of the LVDS driver according to a third embodiment of the present disclosure.

As illustrated in FIG. 5, in the output driver 100C of the LVDS driver according to the present embodiment, each one of the output switches N11, N12, N13, and N14 as described above with reference to FIG. 1 is divided into three N-channel metal oxide semiconductor (NMOS) switches that are arranged parallel to each other as indicated by N100 including N101, N102, and N103.

Moreover, as illustrated in FIG. 5, in the high-potential output control circuit 200C, the NMOS switching transistor N21 as described above with reference to FIG. 1 is divided into three NM OS switches that are arranged parallel to each other as indicated by N201, N202, and N203.

Further, as illustrated in FIG. 5, in the low-potential output control circuit 300C, the NMOS switching transistor N24 as described above with reference to FIG. 1 is divided into three NMOS switches that are arranged parallel to each other as indicated by N301, N302, and N303.

In the above embodiment of the present disclosure, each switch is divided into three NMOS switches that are arranged parallel to each other. However, no limitation is indicated thereby, and it is satisfactory as long as each switch is divided into two or more NMOS switches that are arranged parallel to each other.

Figure 6:
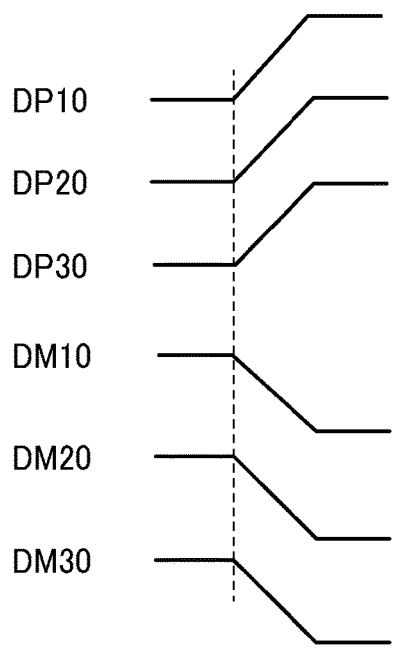
FIG. 6 is a diagram including a plurality of timing charts illustrating signal transition, according to an embodiment of the present disclosure.
Figure 6:
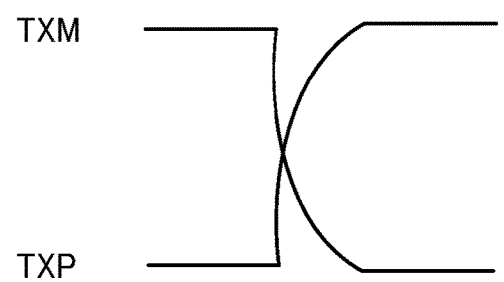
Figure 6:
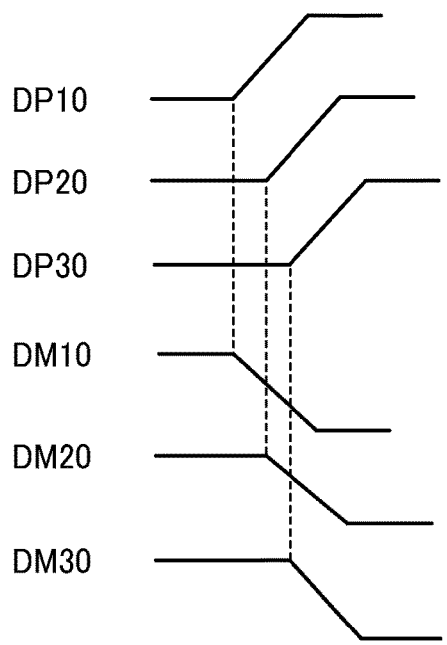
Figure 6:
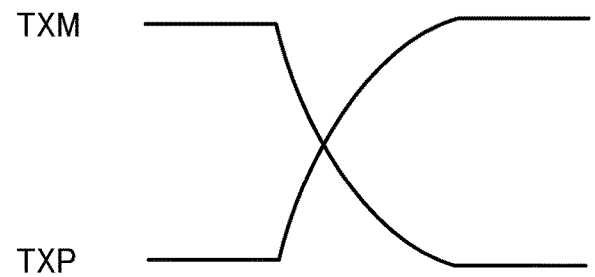

FIG. 6 is a diagram including a plurality of timing charts illustrating signal transition, according to the present embodiment.

As illustrated in FIG. 6, the output driver 100C according to the present embodiment shifts positive data signals DP10, DP20, and DP30 in sequence from L to H, and at the same time, the output driver 100C shifts negative data signals DM10, DM20, and DM30 in sequence from H to L.

Due to such a configuration, the rise time and the fall time of the output terminals TXP and TXM of the output driver can appropriately be adjusted.

Moreover, in the present embodiment, the combinations of whether the operation of each one of the three switches that are parallel to each other is valid or invalid are changed. Due to such a configuration, the value of the output resistance of the output driver that is adjusted by the NMOS source followers N1 and N1A and the PMOS source followers P1 and PIA can further be changed.

For example, when it is assumed that the transistor sizes of the output switches N101, N102, and N103 of the output driver 100C are all same, the ON resistance of the output switches N101, N102, and N103 of the output driver 100C is all R, the data signal of only the output switch N101 is valid, and the gates of the output switch N102 and the output switch N103 are fixed to L and are turned off, the combined resistance of the output switch N101 becomes 3×R.

Figure 7:
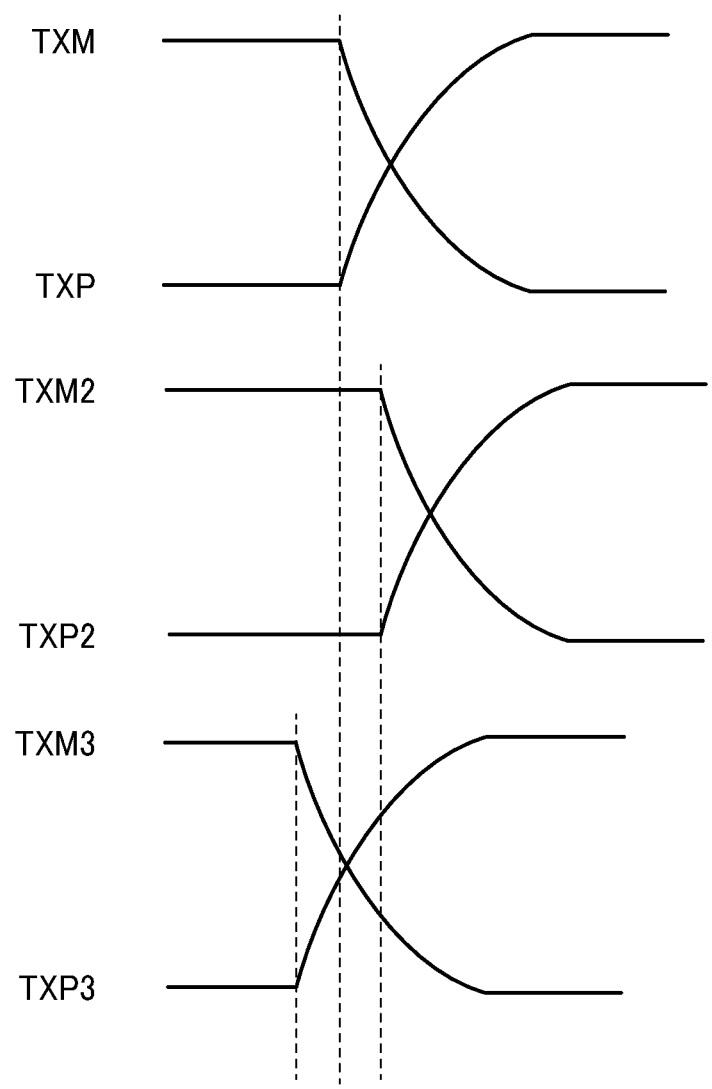
FIG. 7 is another diagram including a plurality of timing charts illustrating signal transition, according to an embodiment of the present disclosure.

FIG. 7 is another diagram including a plurality of timing charts illustrating signal transition, according to the present embodiment.

As illustrated in FIG. 7, the output driver 100C changes the timing at which the data signals DP10, DP20, and DP30 are input on a channel-by-channel basis. In a similar manner, the output driver 100C changes the timing at which the data signals DM10, DM20, and DM30 are input on a channel-by-channel basis.

Due to such a configuration as described above, the timing at which the data is output can appropriately be adjusted on a channel-by-channel basis.

As described above, according to the present embodiment, the rise time and the fall time of the output driver can appropriately be adjusted, and measures can be taken against electro magnetic interference (EMI). Moreover, in the present embodiment, when there are irregularities in skew between a pair of channels, such irregularities in skew can be corrected by adjusting the timing at which the data is output on a channel-by-channel basis.

Fourth Embodiment

A fourth embodiment of the present disclosure is described below.

Note that the fourth embodiment of the present disclosure as will be described later is different from the first embodiment, the second embodiment, and the third embodiment of the present disclosure as described above in respect that the electrical potential at each one of the gates of the NMOS source follower N1 and the PMOS source follower P1 is changed depending on an emphasis signal. Note that like reference signs are given to elements similar to those described in the first embodiment, the second embodiment, and the third embodiment, and their detailed description is omitted in the following description of the fourth embodiment of the present disclosure.

Figure 8:
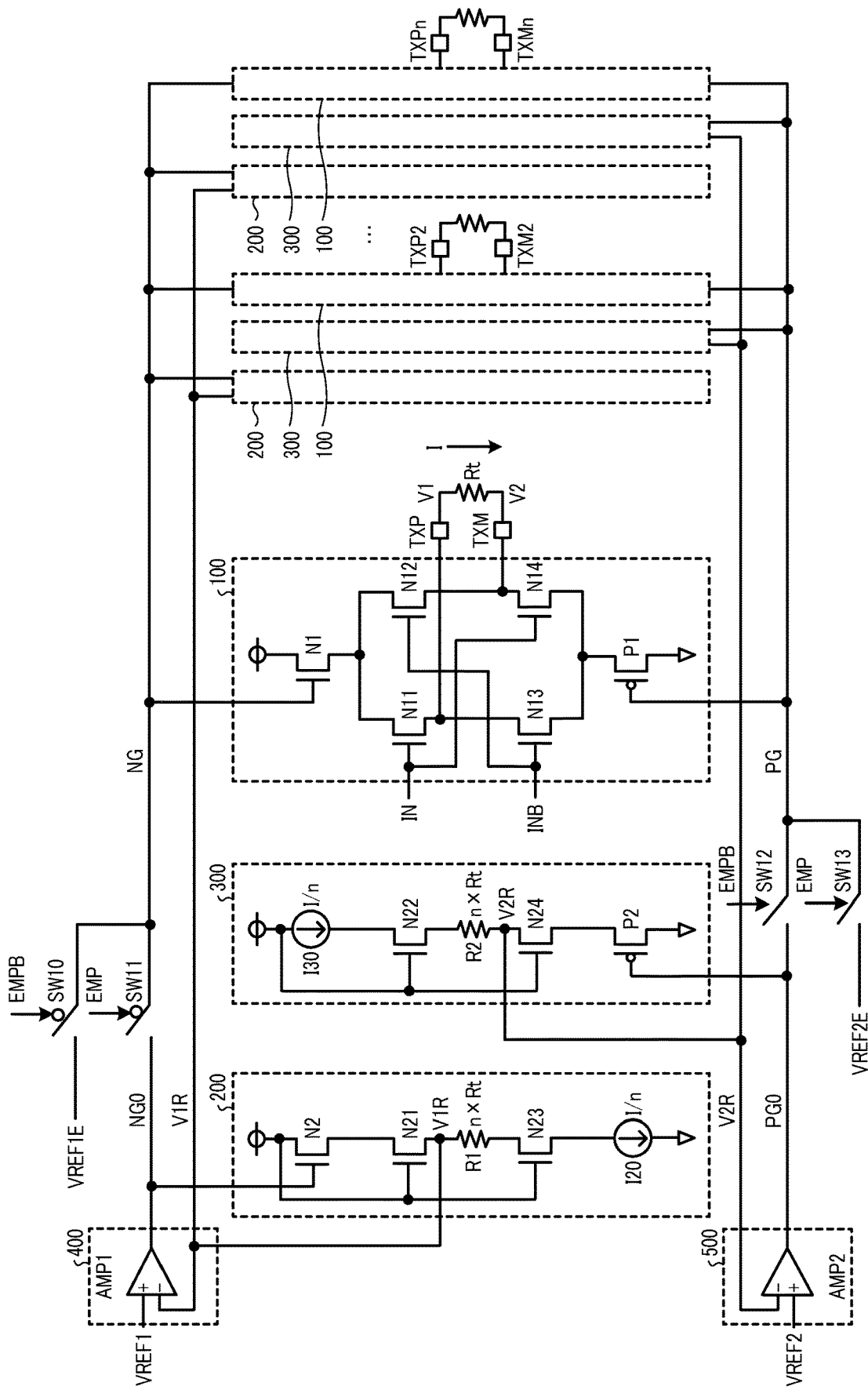
FIG. 8 is a diagram illustrating a configuration or structure of a LVDS driver according to a fourth embodiment of the present disclosure.

FIG. 8 is a diagram illustrating a configuration or structure of the LVDS driver according to a fourth embodiment of the present disclosure.

Figure 9A:
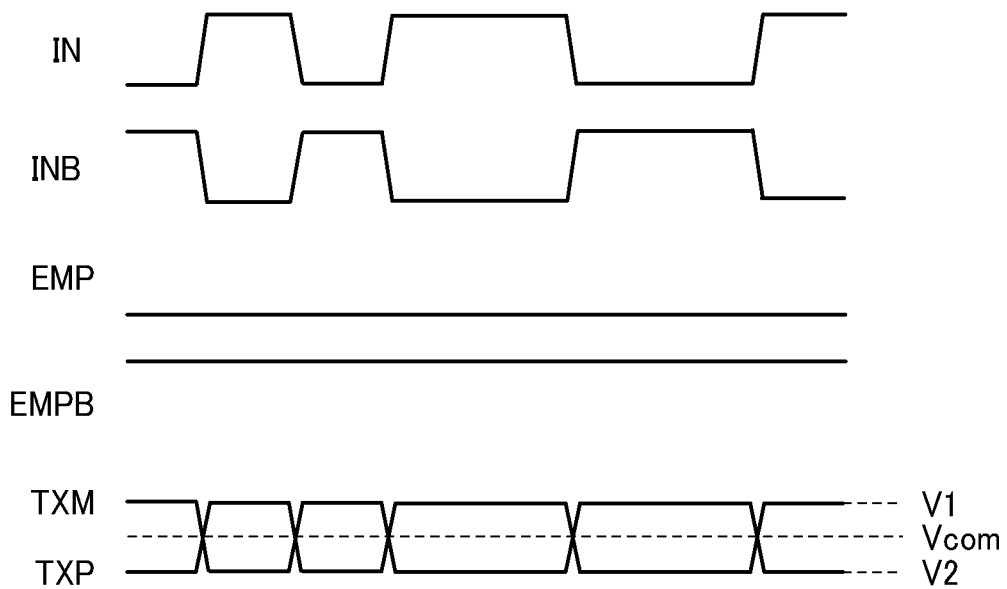
FIG. 9A, FIG. 9B, and FIG. 9C are diagrams each illustrating the waveform of an input signal or an output signal, according to an embodiment of the present disclosure.
Figure 9B:
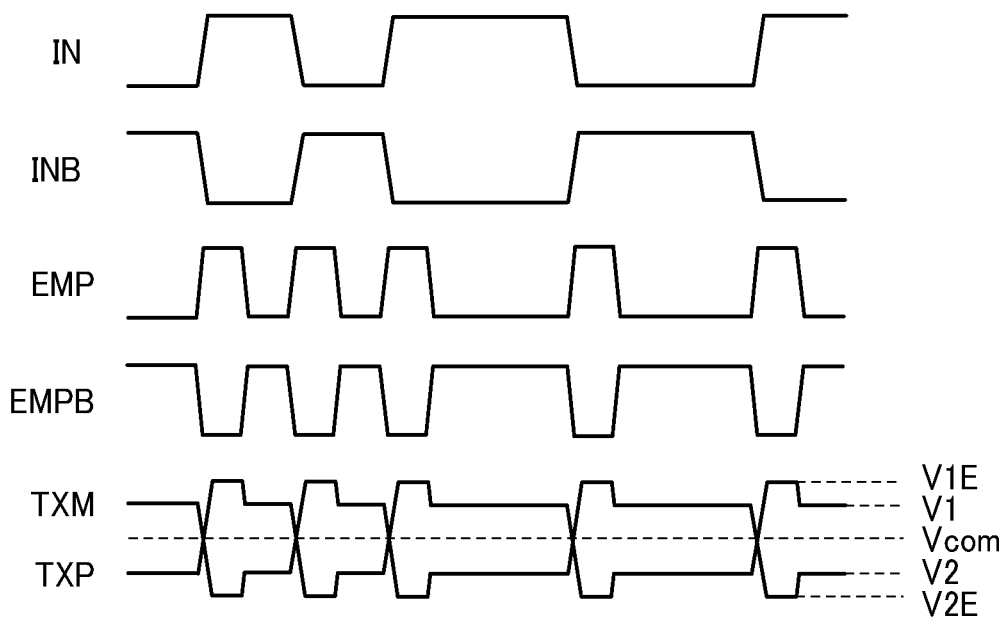
Figure 9C:
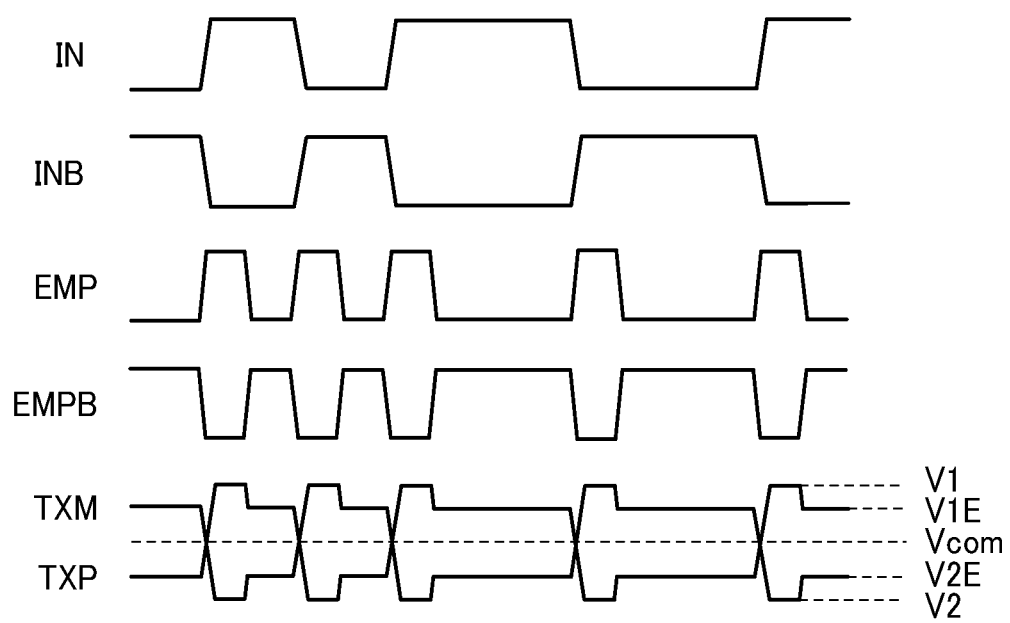

FIG. 9A, FIG. 9B, and FIG. 9C are diagrams each illustrating the waveform of an input signal or an output signal, according to the present embodiment.

In FIG. 9A, the waveform of an output signal when an emphasis signal EMP and an emphasis signal EMPB are invalid is illustrated for comparison purposes.

As illustrated in FIG. 8, a switch SW10 and a switch SW11 are arranged for the gate of the NMOS source follower N1 of the output driver 100. Moreover, as illustrated in FIG. 9B, it is configured such that the electrical potential of an output signal NG from the high-potential generation circuit 400 is switched based on the emphasis signal EMP and the emphasis signal EMPB.

Assuming that a reference voltage VREF1E is higher than an output signal NGO from the high-potential generation circuit 400 by 0.1 V, the electrical potential of the output terminal TXP is V1 when EMP=L, and the electrical potential that is applied to the gate of the NMOS source follower N1 increases by 0.1 V when EMP=H. Due to such a configuration, the electrical potential of the source of the NMOS source follower N1 of the output driver 100 increases by 0.1 V, and the electrical potential of the output terminal TXP can be calculated as follows.

$$V1E = V1 + 0.1 \text{ V}$$

In a similar manner to the above, a switch SW12 and a switch SW13 are arranged for the gate of the PMOS source follower P1 of the output driver 100. Moreover, as illustrated in FIG. 9B, it is configured such that the electrical potential of an output signal PG from the low-potential generation circuit 500 is switched based on the emphasis signal EMP and the emphasis signal EMPB.

Assuming that a reference voltage VREF2E is lower than an output signal PG0 from the low-potential generation circuit 500 by 0.1 V, the electrical potential of the output terminal TXP is V2 when EMP=L, and the electrical potential that is applied to the gate of the PMOS source follower P1 decreases by 0.1 V when EMP=H. Due to such a configuration, the electrical potential of the source of the PMOS source follower P1 decreases by 0.1 V, and the electrical potential of the output terminal TXM can be calculated as follows.

$$V2E = V2 - 0.1 \text{ V}$$

As illustrated in FIG. 9C, it may be configured such that the electrical potential of the reference voltage VREF1E will be lower than NGO and the electrical potential of the reference voltage VREF2E will be higher than PG0.

As described above, according to the present embodiment, the voltage level when the emphasis is turned on can appropriately be adjusted with a relatively simple configuration.

Moreover, in the present embodiment, as the high-potential generation circuit 400 and the low-potential generation circuit 500 are used in common, the power consumption can be reduced, and the voltage levels of the reference voltage VREF1E and the reference voltage VREF2E that are preliminarily prepared and determined are appropriately adjusted. As a result, the switching between pre-emphasis and de-emphasis can easily be performed, and the signal waveform can be optimized depending on the type of a transmission line.

Note that numerous additional modifications and variations are possible in light of the above teachings. It is therefore to be understood that within the scope of the appended claims, the disclosure of the present disclosure may be practiced otherwise than as specifically described herein. For example, elements and/or features of different illustrative embodiments may be combined with each other and/or substituted for each other within the scope of this disclosure and appended claims.

What is claimed is:

1. A low voltage differential signal driver comprising:
an output driver including an N-channel source follower, a P-channel source follower, and a plurality of differential switching circuits, the output driver being configured to output a differential output;
a plurality of high-potential output control circuits configured to control a terminal of the N-channel source follower of the output driver to make a high-potential output of the differential output from the output driver have a prescribed value;
a plurality of low-potential output control circuits configured to control a terminal of the P-channel source follower of the output driver to make a low-potential output of the differential output from the output driver have a prescribed value, one of the plurality of high-potential output control circuits and one of the plurality of low-potential output control circuits being used in a pair;
a single high-potential generation circuit used in common for the plurality of high-potential output control circuits, the high-potential generation circuit being configured to supply the plurality of high-potential output control circuits with a prescribed driving voltage; and
a low-potential generation circuit used in common for the plurality of low-potential output control circuits, the low-potential generation circuit being configured to supply the plurality of low-potential output control circuits with a prescribed driving voltage.

2. The low voltage differential signal driver according to claim 1,
  wherein the high-potential generation circuit includes a differential amplifier configured to output a signal to the terminal of the N-channel source follower of the output driver,
  wherein the low-potential generation circuit includes another differential amplifier configured to output another signal to the terminal of the P-channel source follower of the output driver, and
  wherein the differential amplifier is configured to perform feedback control to make an electrical potential between any desired one of the plurality of differential switching circuits of the output driver and resistance of one of the plurality of high-potential output control circuits or one of the plurality of low-potential output control circuits have a prescribed of voltage.

3. The low voltage differential signal driver according to claim 1, wherein the output driver is configured to adjust output resistance to have a desired value.

4. The low voltage differential signal driver according to claim 1, further comprising at least two switches coupled to each other in parallel, the at least two switches including a switch that configures one of the plurality of differential switching circuits of the output driver, a switch that configures one of the plurality of high-potential output control circuits, and a switch that configures one of the plurality of low-potential output control circuits.

5. The low voltage differential signal driver according to claim 1, wherein an electrical potential of each one of the terminal of the N-channel source follower and the P-channel source follower of the output driver is changed depending on an emphasis signal.

* * * * *